US012733332B2

(12) United States Patent
Zhou et al.

(10) Patent No.: US 12,733,332 B2
(45) Date of Patent: Sep. 8, 2026

(54) QUANTUM DOT LIGHT-EMITTING DIODES, MANUFACTURING METHOD THEREOF, AND QUANTUM DOT FILMS

(71) Applicant: TCL TECHNOLOGY GROUP CORPORATION, Huizhou (CN)

(72) Inventors: Likuan Zhou, Huizhou (CN); Yixing Yang, Huizhou (CN)

(73) Assignee: TCL TECHNOLOGY GROUP CORPORATION, Huizhou (CN)

(*) Notice: Subject to any disclaimer, the term of this patent is extended or adjusted under 35 U.S.C. 154(b) by 359 days.

(21) Appl. No.: 18/527,364

(22) Filed: Dec. 3, 2023

(65) Prior Publication Data

US 2024/0099040 A1 Mar. 21, 2024

Related U.S. Application Data

(63) Continuation of application No. PCT/CN2021/143946, filed on Dec. 31, 2021.

(30) Foreign Application Priority Data

Jun. 2, 2021 (CN) ........................ 202110613846.2

(51) Int. Cl.
*H10K 50/11* (2023.01)
*B82Y 20/00* (2011.01)
(Continued)

(52) U.S. Cl.
CPC .............. *H10K 50/11* (2023.02); *B82Y 20/00* (2013.01); *H10K 71/13* (2023.02); *H10K 71/00* (2023.02)

(58) Field of Classification Search
None
See application file for complete search history.

(56) References Cited

U.S. PATENT DOCUMENTS

2008/0296555 A1 12/2008 Miller
2012/0274231 A1 11/2012 Tu
(Continued)

FOREIGN PATENT DOCUMENTS

CN 101681966 A 3/2010
CN 104966725 A 10/2015
(Continued)

OTHER PUBLICATIONS

Chinese Office Action issued in corresponding Chinese Patent Application No. 202110613846.2 dated May 9, 2025, pp. 1-11.
(Continued)

*Primary Examiner* — Anthony Ho
(74) *Attorney, Agent, or Firm* — PV IP PC; Wei Te Chung

(57) ABSTRACT

The present disclosure provides a quantum dot light-emitting diode, a manufacturing method thereof, and a quantum dot film. The quantum dot light-emitting diode includes a first electrode, a second electrode, and a quantum dot light-emitting layer. The quantum dot light-emitting layer is disposed between the first electrode and the second electrode. The quantum dot light-emitting layer includes a first quantum dot and a second quantum dot, and an absolute value of a difference between a photoluminescence peak wavelength of the first quantum dot and a photoluminescence peak wavelength of the second quantum dot is less than or equal to 10 nm.

16 Claims, 5 Drawing Sheets

(51) Int. Cl.

| | |
|---|---|
| ***H10K 71/13*** | (2023.01) |
| *H10K 71/00* | (2023.01) |

(56) References Cited

U.S. PATENT DOCUMENTS

| | | | | |
|---|---|---|---|---|
| 2016/0351843 | A1* | 12/2016 | Yang | H10K 50/115 |
| 2020/0270520 | A1 | 8/2020 | Li | |
| 2020/0411784 | A1 | 12/2020 | Jang | |
| 2021/0040386 | A1 | 2/2021 | Min | |

FOREIGN PATENT DOCUMENTS

| | | | |
|---|---|---|---|
| CN | 105226159 | A | 1/2016 |
| CN | 106384786 | A | 2/2017 |
| CN | 109932358 | A | 6/2019 |
| CN | 110168763 | A | 8/2019 |
| CN | 111490173 | A | 8/2020 |
| CN | 112186113 | A | 1/2021 |
| KR | 20200029853 | A | 3/2020 |

OTHER PUBLICATIONS

International Search Report in International application No. PCT/CN2021/143946, mailed on Feb. 28, 2022.

Written Opinion of the International Search Authority in International application No. PCT/CN2021/143946, mailed on Feb. 28, 2022.

* cited by examiner

Formulating a quantum dot solution including a first quantum dot and a second quantum dot, wherein an absolute value of a difference between the photoluminescence peak wavelengths of the first and second quantum dots is less than or equal to 10 nm — 21

Applying and curing the quantum dot solution on the first electrode, to form the quantum dot light-emitting layer — 22

FIG. 3

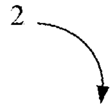

Formulating a quantum dot solution including at least three quantum dots, wherein a difference between a maximum value and a minimum value of the photoluminescence peak full widths at half-maximum of the at least three quantum dots is less than or equal to 10 nm — 221

Applying and curing the quantum dot solution on the first electrode, to form the quantum dot light-emitting layer — 222

FIG. 4

QUANTUM DOT LIGHT-EMITTING DIODES, MANUFACTURING METHOD THEREOF, AND QUANTUM DOT FILMS

CROSS-REFERENCE TO RELATED APPLICATIONS

This application is a continuation of International Application No. PCT/CN2021/143946, filed on Dec. 31, 2021, which claims priority to Chinese Patent Application 202110613846.2, filed on Jun. 2, 2021, entitled "quantum dot light-emitting diode, manufacturing method thereof, and quantum dot film", the contents of which are incorporated herein by reference in their entireties.

TECHNICAL FIELD

The present disclosure relates to the field of quantum dots, and in particular, to a quantum dot light-emitting diode, a manufacturing method thereof, and a quantum dot film.

BACKGROUND

Colloidal quantum dot nanomaterials have unique photoelectric properties, such as fluorescence quantum efficiency close to 100%, tunable optical wavelength, extremely narrow full width at half-maximum, and solution processability, thus becoming one of the hotspots for optoelectronic device research. In recent years, with the in-depth research on quantum dot light-emitting diodes (QLEDs), great progress has been made in current efficiency and lifetime of devices.

In order to obtain a desired emission wavelength and a narrow size distribution, quantum dot materials can generally be synthesized by a high-temperature thermal injection process to form a core, or by alternately adsorbing ion layers to grow a shell layer. However, different batches of quantum dot materials may deviate from each other in light-emitting wavelength and size distribution due to process limitations, and their optoelectronic properties may differ to a certain extent. When different batches of the synthesized quantum dot materials are used, it is necessary to adjust the process conditions for preparing the light-emitting diode according to the photoelectric performances of different quantum dot materials, which, as a result, raises the difficulty of the process and reduces the production efficiency.

In light of the above defects, it is desirable to provide to a quantum dot light-emitting diode, a manufacturing method thereof, and a quantum dot film, which is manufactured using quantum dot materials having little difference in photoelectric properties.

SUMMARY

An embodiment of the present disclosure provides a quantum dot light-emitting diode including:

- a first electrode;
- a second electrode; and
- a quantum dot light-emitting layer disposed between the first electrode and the second electrode;
- wherein the quantum dot light-emitting layer includes a first quantum dot and a second quantum dot, and an absolute value of a difference between a photoluminescence peak wavelength of the first quantum dot and a photoluminescence peak wavelength of the second quantum dot is less than or equal to 10 nm.

In an embodiment, the absolute value of the difference between the photoluminescence peak wavelength of the first quantum dot and the photoluminescence peak wavelength of the second quantum dot is less than or equal to 5 nm.

In an embodiment, the quantum dot light-emitting layer is composed of the first quantum dot and the second quantum dot, the photoluminescence peak wavelength of the second quantum dot is greater than the photoluminescence peak wavelength of the first quantum dot, a mass fraction of the second quantum dot is greater than 50 wt % and less than 100 wt %, and a mass fraction of the first quantum dot is greater than 0 wt % and less than 50 wt %.

In an embodiment, a full width at half-maximum of the photoluminescence peak of the second quantum dot is less than a full width at half-maximum of the photoluminescence peak of the first quantum dot.

In an embodiment, the quantum dot light-emitting layer includes at least three quantum dots, a difference between a maximum value and a minimum value of photoluminescence peak wavelengths of the at least three quantum dots is less than or equal to 10 nm, and a mass fraction of a quantum dot having a median of the photoluminescence peak wavelengths of the at least three quantum dots is greater than an average of mass fractions of the at least three quantum dots.

In an embodiment, among the at least three quantum dots, one or two of quantum dots having the median of the photoluminescence peak wavelengths have a narrowest full width at half-maximum.

In an embodiment, an absolute value of a difference between a full width at half-maximum of the photoluminescence peak of the first quantum dot and a full width at half-maximum of the photoluminescence peak of the second quantum dot is less than or equal to 10 nm.

In an embodiment, an absolute value of a difference between a full width at half-maximum of the photoluminescence peak of the first quantum dot and a full width at half-maximum of the photoluminescence peak of the second quantum dot is less than or equal to 3 nm.

An embodiment of the present disclosure further provides a quantum dot film including:

- a first quantum dot and a second quantum dot, wherein an absolute value of a difference between a photoluminescence peak wavelength of the first quantum dot and a photoluminescence peak wavelength of the second quantum dot is less than or equal to 10 nm.

In an embodiment, the absolute value of the difference between the photoluminescence peak wavelength of the first quantum dot and the photoluminescence peak wavelength of the second quantum dot is less than or equal to 5 nm.

In an embodiment, the quantum dot film is composed of the first quantum dot and the second quantum dot, the photoluminescence peak wavelength of the second quantum dot is greater than the photoluminescence peak wavelength of the first quantum dot, and a mass fraction of the second quantum dot is greater than a mass fraction of the first quantum dot.

In an embodiment, a full width at half-maximum of the photoluminescence peak of the second quantum dot is less than a full width at half-maximum of the photoluminescence peak of the first quantum dot.

In an embodiment, the quantum dot film includes at least three quantum dots, a difference between a maximum value and a minimum value of photoluminescence peak wavelengths of the at least three quantum dots is less than or equal to 10 nm, and a mass fraction of a quantum dot having a median of the photoluminescence peak wavelengths of the at least three quantum dots is greater than an average of mass fractions of the at least three quantum dots.

In an embodiment, among the at least three quantum dots, one or two of quantum dots having the median of the photoluminescence peak wavelengths have a narrowest full width at half-maximum.

In an embodiment, an absolute value of a difference between a full width at half-maximum of the photoluminescence peak of the first quantum dot and a full width at half-maximum of the photoluminescence peak of the second quantum dot is less than or equal to 10 nm.

In an embodiment, an absolute value of a difference between a full width at half-maximum of the photoluminescence peak of the first quantum dot and a full width at half-maximum of the photoluminescence peak of the second quantum dot is less than or equal to 3 nm.

An embodiment of the present disclosure further provides a method of manufacturing a quantum dot light-emitting diode, including the following steps of:

forming a first electrode;

forming a quantum dot light-emitting layer on the first electrode; and forming a second electrode on the quantum dot light-emitting layer;

wherein the forming the quantum dot light-emitting layer on the first electrode includes:

formulating a quantum dot solution including a first quantum dot and a second quantum dot, wherein an absolute value of a difference between a photoluminescence peak wavelength of the first quantum dot and a photoluminescence peak wavelength of the second quantum dot is less than or equal to 10 nm; and applying the quantum dot solution on the first electrode, and curing the quantum dot solution to form the quantum dot light-emitting layer.

In an embodiment, the absolute value of the difference between the photoluminescence peak wavelength of the first quantum dot and the photoluminescence peak wavelength of the second quantum dot is less than or equal to 5 nm.

In an embodiment, an absolute value of a difference between a full width at half-maximum of the photoluminescence peak of the first quantum dot and a full width at half-maximum of the photoluminescence peak of the second quantum dot is less than or equal to 10 nm.

In an embodiment, an absolute value of a difference between a full width at half-maximum of the photoluminescence peak of the first quantum dot and a full width at half-maximum of the photoluminescence peak of the second quantum dot is less than or equal to 3 nm.

According to the present disclosure, there are a quantum dot light-emitting diode, a manufacturing method thereof, and a quantum dot film. The quantum dot light-emitting diode includes a first electrode, a second electrode, and a quantum dot light-emitting layer. The quantum dot light-emitting layer is disposed between the first electrode and the second electrode. The light-emitting device of the present disclosure can be manufactured by using at least two quantum dots having similar photoelectric properties, thereby reducing the process difficulty and improving the production efficiency.

BRIEF DESCRIPTION OF THE DRAWINGS

In order to illustrate the technical solutions of the present disclosure clearly, the following will briefly describe the accompanying drawings involved in the description of embodiments. It will be apparent that the drawings in the following description are merely some of the embodiments of the present disclosure, and other drawings may be obtained by those skilled in the art without involving any inventive effort based on these drawings.

FIG. 3 is a flowchart of steps for forming a quantum dot light-emitting layer on a first electrode according to an embodiment of the present disclosure.

FIG. 4 is a flowchart of steps for forming a quantum dot light-emitting layer on a first electrode according to an embodiment of the present disclosure.

DETAILED DESCRIPTION OF THE EMBODIMENTS

The technical solutions in the present disclosure will be fully and clearly described with reference to the accompanying drawings. It is apparent that the described embodiments are only a part of the embodiments of the present disclosure, rather than all of the embodiments. Based on the embodiments in the present disclosure, all other embodiments obtained by a person skilled in the art without involving any inventive effort fall within the scope of the present disclosure.

The inventors have found in the synthesis of quantum dot materials that, there are some differences in fluorescence parameters of different batches of quantum dot materials obtained with the same synthetic formulation, such as photoluminescence spectroscopy (PL), full width at half-maximum (FWHM), and photoluminescence quantum yields (QY). The reason for this may lie in that the process for nucleation and/or growth of quantum dot materials is greatly sensitive to process conditions during the synthesis, such as the stability of reaction temperatures, the nucleation instantaneous state by thermal injection, and the distribution concentrations of precursors at various stages in a reaction system. As a result, although the quantum dot materials synthesized in different batches have similar basic properties, the luminescence wavelength and the full width at half-maximum thereof are different from each other to some extent.

To this end, the present disclosure provides a quantum dot light-emitting diode made from quantum dots having little difference in photoelectric properties, a method for manufacturing the same, and a quantum dot film. The quantum dot light-emitting diode according to the present disclosure may be applied in quantum dot light-emitting diode display devices, photodetectors, or photovoltaic devices such as solar cells, or the like.

An embodiment of the present disclosure provides a quantum dot light-emitting diode, which includes a first electrode, a second electrode, and a quantum dot light-emitting layer. The quantum dot light-emitting layer is disposed between the first electrode and the second electrode. The quantum dot light-emitting layer comprises a first quantum dot and a second quantum dot. An absolute value of a difference between a photoluminescence peak wavelength of the first quantum dot and a photoluminescence peak wavelength of the second quantum dot is less than or equal to 10 nm. In the embodiment of the present disclosure, the light-emitting device can be manufactured by using two quantum dots having similar photoelectric properties, thereby reducing the process difficulty and improving the production efficiency.

Hereinafter, the quantum dot light-emitting diode according to an embodiment of the present disclosure will be described in detail with reference to the accompanying drawings.

Figure 1:
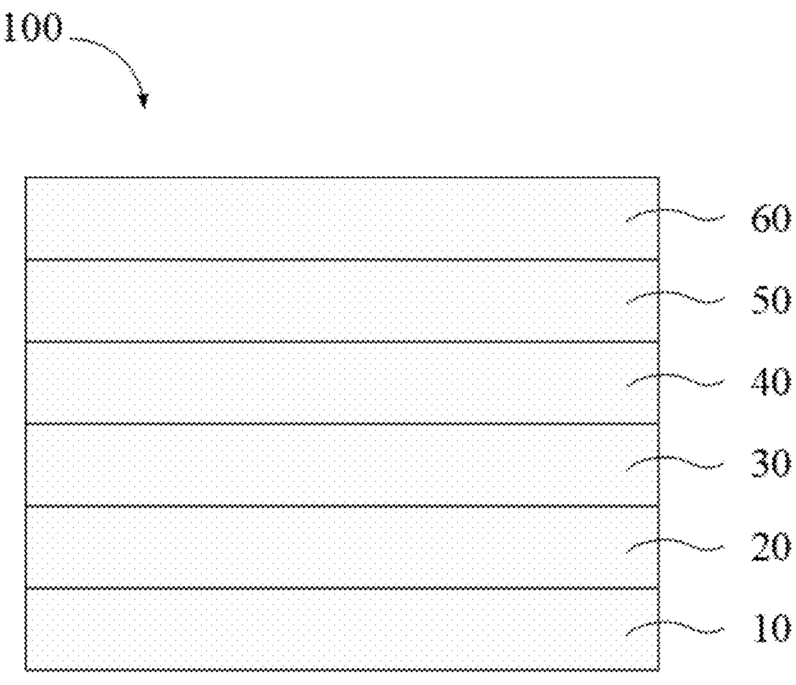
FIG. 1 is a schematic diagram of a structure of a quantum dot light-emitting diode according to an embodiment of the present disclosure.

Referring to FIG. 1, it is a schematic diagram of a structure of a quantum dot light-emitting diode according to an embodiment of the present disclosure. A quantum dot light-emitting diode 100 includes a first electrode 10, a hole injection layer 20, a hole transport layer 30, a quantum dot light-emitting layer 40, an electron transport layer 50, and a second electrode 60 which are stacked in sequence.

In a first embodiment, the first electrode 10 may be an anode. A material for the anode may be selected from one or more of indium tin oxide, fluorine-doped tin oxide, indium zinc oxide, graphene, or carbon nanotubes.

A material for the hole injection layer 20 may be one or more of poly(3,4-ethylenedioxythiophene):polystyrene sulfonate (PEDOT:PSS), nickel oxide, molybdenum oxide, tungsten oxide, vanadium oxide, molybdenum sulfide, tungsten sulfide, or copper oxide.

A material for the hole transport layer 30 may be one or more of poly(9-vinylcarbazole) (PVK), poly[bis(4-phenyl)(4-butylphenyl)amine] (Poly-TPD), 4,4'-bis(9-carbazolyl)-biphenyl (CBP), 4,4',4"-tris(carbazol-9-yl)-triphenylamine (TCTA), or poly[(9,9-dioctylfluorenyl-2,7-diyl)-co-(4,4'-(N-(4-sec-butylphenyl)diphenylamine)] (TFB).

The quantum dot light-emitting layer 40 comprises a first quantum dot and a second quantum dot. The first and second quantum dots are both colloidal quantum dots. That is, the first quantum dot and the second quantum dot may be dispersed and reserved in a solution, respectively. During formation of the quantum dot light-emitting layer, a first solution containing the first quantum dot may be mixed with a second solution containing the second quantum dot in a certain ratio. A solvent of the first solution may be same as, or similar to in nature a solvent of the second solution, for example, both are polar solvents or non-polar solvents. In an embodiment, the solvent of the first solution is same as the solvent of the second solution.

It is to be noted that, when the colloidal quantum dots are dispersed in a solution without forming a quantum dot film, it is impossible to determine the electroluminescence spectra of the colloidal quantum dots, and therefore, the optical properties of the quantum dots are characterized by the photoluminescence properties thereof. When the colloidal quantum dots are formed into the quantum dot film, they may have a low photoluminescence efficiency and a high electroluminescence efficiency, and thus the performances of the quantum dots are characterized by their electroluminescence characteristics. It is to be noted that under the existing conditions for processing quantum dot materials, the particle sizes of red quantum dot materials, green quantum dot materials, and blue quantum dot materials applied in the quantum dot light-emitting device are 12 nm to 15 nm, 10 nm to 12 nm, and 8 nm to 10 nm, respectively, and where these quantum dots as materials for the light-emitting layer are used to prepare a quantum dot light-emitting device, they may have an electroluminescence peak having a red shift of 0 nm to 5 nm compared with the photoluminescence peak thereof.

The photoluminescence spectra of the first and second quantum dots are in the same visible light region. For example, both of the first and second quantum dots are green quantum dots. In an embodiment, the first quantum dot and the second quantum dot may be different batches of quantum dots manufactured using the same material and the same process. In another embodiment, the first quantum dot and the second quantum dot may be quantum dots manufactured using different materials and/or different processes, and it is sufficient that the photoluminescence spectra of the first quantum dot and the second quantum dot are in the same visible light region and their photoluminescence peak wavelengths are close to each other. The phrase "photoluminescence peak wavelengths being close to each other" may refer to the absolute value of the difference between the photoluminescence peak wavelength of the first quantum dot and the photoluminescence peak wavelength of the second quantum dot is less than or equal to 10 nm. When the difference between the photoluminescence peak wavelength of the first quantum dot and the photoluminescence peak wavelength of the second quantum dot is sufficiently low, the electroluminescence peaks of the first quantum dot and the second quantum dot overlap after the red shift to obtain an electroluminescence spectrum with a higher color purity, after the quantum dot solution is formed into a film. Further, the absolute value of the difference between the photoluminescence peak wavelength of the first quantum dot and the photoluminescence peak wavelength of the second quantum dot is less than or equal to 5 nm.

In order to allow the electroluminescence peak of the quantum dot light-emitting layer to have a narrow full width at half-maximum, in an embodiment, an absolute value of a difference between a full width at half-maximum of a photoluminescence peak of the first quantum dot and a full width at half-maximum of a photoluminescence peak of the second quantum dot is less than or equal to 10 nm. Further, the absolute value of the difference between the full width at half-maximum of the photoluminescence peak of the first quantum dot and that of the second quantum dot is less than or equal to 3 nm.

In the present disclosure, unless otherwise specified, all quantum dots encompassed in the first quantum dot are manufactured in the same process and have little difference in photoelectric performances, and all quantum dots encompassed in the second quantum dot are manufactured in the same process and have little difference in photoelectric performances. For example, the photoelectric performances of a plurality of electroluminescent devices prepared from the first quantum dot, such as an external quantum efficiency (EQE) and time taken from the manual maximum luminance of 1000 nit to 95% of the maximum luminance (expressed by $T_{95}$@1000 nit), fluctuate in variability by no more than 50%. If the difference in the performances is too large, a quantum dot device prepared from the mixed quantum dots as the material for the light-emitting layer, generates a serious non-radiation recombination transition, resulting in degradation of the device performances, and failure to obtain stable photoelectric performances. When the difference in the photoelectric properties of the same type of quantum dots is not too large, it is possible to ensure that the fluorescence portions by electroluminescence have a large overlapping portion after the quantum dot solution is formed into a film, avoiding the occurrence of shoulder peaks or multiple peaks.

The quantum dot light-emitting layer may include a red quantum dot light-emitting layer, a green quantum dot light-emitting layer, and a blue quantum dot light-emitting layer. The quantum dots may include at least one of, in the periodic table of elements, a group IV, a group II-V, a group II-VI, a group III-VI, a group III-V, a group IV-VI, a group VI-VI, a group VIII-VI, a group I-III-VI, a group II-IV-VI, or a group II-IV-V, in a form of a single or composite structure of quantum dots. The composite structure of quantum dots includes a core-shell structure, in which a material for constituting the core of the core-shell structure includes at least one of CdSe, CdS, CdTe, CdSeTe, CdZnS, PbSe, ZnTe, CdSeS, PbS, PbTe, HgS, HgSe, HgTe, GaN, GaP, GaAs, InP, InAs, InZnP, InGaP, or InGaN, and a material for constituting the shell of the core-shell structure includes at least one of ZnSe, ZnS, or ZnSeS.

The first quantum dot and the second quantum dot have the same or similar dispersibility in the same solvent, so as to avoid solubility deterioration due to the intermixing of different components, and to avoid interference with the processing of the quantum dot light-emitting diode using a solution method. As used herein, "solution method" refers to a process for forming a quantum dot light-emitting layer using colloidal quantum dots dispersed in a solution. The solution method may be, but is not limited to, one or more of a spin coating process, a dip coating process, a printing process, an inkjet process, a spray coating process, a roller coating process, a blade coating process, a casting process, an electrolytic deposition process, a slit coating process, or a strip coating process. More specifically, the surface of the first quantum dot has a first organic ligand. The surface of the second quantum dot has a second organic ligand. The first organic ligand and the second organic ligand can be dissolved in the same solvent. In an embodiment, the first organic ligand is same as the second organic ligand. The first organic ligand and the second organic ligand are each independently selected from one or more of oleic acid, oleylamine, an alkyl acid having 4 to 20 carbon atoms, trioctylphosphine, tributylphosphine, trioctylphosphine oxide, hexylphosphonic acid, ethylamine, triethylamine, propylamine, tripropylamine, butylamine, tributylamine, pentylamine, tripentylamine, n-hexylamine, trihexylamine, heptylamine, octylamine, trioctylamine, di-n-octylamine, decylamine, dodecylamine, trilaurylamine, tetradecylamine, hexadecylamine, octadecylamine, dioctadecylamine, or dodecanethiol.

When the first quantum dot and the second quantum dot are dispersed in a solvent, the distance between the quantum dot luminescent cores of the first and second quantum dots is too large to generate an energy resonance transfer. After the quantum dot solution is cured to form a film, the distance between the first quantum dot and the second quantum dot is shortened to a range where the energy resonance transfer may occur. Specifically, the energy resonance transfer in the quantum dot film is a phenomenon in which energy is transferred from a high-energy state donor (emitting light of short wavelength) to an adjacent low-energy state acceptor (emitting light of long wavelength), representing as a red shift of the electroluminescence peak. When the photoluminescence peak wavelengths of the first quantum dot and the second quantum dot are sufficiently close to each other, for example, the absolute value of the difference between the photoluminescence peak wavelength of the first quantum dot and the photoluminescence peak wavelength of the second quantum dot is less than or equal to 10 nm, the spacing between the first quantum dot and the second quantum dot is reduced to a range capable of generating an energy resonance transfer after the quantum dot solution is cured to form a film. When the energy resonance transfer occurs between the first quantum dot and the second quantum dot, the energy may be transferred from the high energy state donor (a quantum dot emitting light of a shorter wavelength) to the adjacent low energy state acceptor (a quantum dot emitting light of a longer wavelength). The quantum dot emitting light of a shorter wavelength releases energy, generating a red shift, and the quantum dot emitting light of a longer wavelength receive energy, generating a blue shift. That is, after the two quantum dots are subjected to energy resonance, their luminescence peaks are close to each other and superimposed, obtaining enhanced fluorescence at the same wavelength position, and giving an electroluminescence spectrum with higher color purity.

It has been experimentally demonstrated that, adjusting mass fractions and the full widths at half-maximum of the first and second quantum dots can significantly enhance the fluorescence emitted at the peak wavelength, and render a narrowing trend in the full width at half-maximum of the quantum dot electroluminescence peak, thereby exhibiting better monochromaticity. Meanwhile, the photovoltaic performance exhibited by the device is dominated by a portion with the most significant enhancement of fluorescence, and the overall photovoltaic performance thereof is close to a property of an optimal one of the first quantum dot and the second quantum dot.

For example, in the present embodiment, the quantum dot light-emitting layer is composed of the first quantum dot and the second quantum dot. The photoluminescence peak wavelength $\lambda(b)$ of the second quantum dot is larger than the photoluminescence peak wavelength $\lambda(a)$ of the first quantum dot. It has been experimentally demonstrated that, by allowing the mass fraction of the second quantum dot to be larger than that of the first quantum dot, the fluorescence emitted at the peak wavelength can be improved significantly, and the full width at half-maximum of the quantum dot electroluminescence peak can be narrowed, thereby obtaining good photoelectric performances. Specifically, the mass fraction of the second quantum dots is greater than 50 wt % and less than 100 wt %, and the mass fraction of the first quantum dots is greater than 0 wt % and less than 50 wt %.

Energy loss may occur in the process of energy transfer resonance. If the mass fraction of the second quantum dot is less than that of the first quantum dot, the red shift of the first quantum dot mat be relatively low due to the energy loss, and the electroluminescence peaks of the second quantum dot and the first quantum dot overlap to a low degree, resulting in impossibility to obtain significant fluorescence enhancement and to narrow the full width at half-maximum. In addition, due to the energy loss, the blue shift degree of the electroluminescence peak of the second quantum dot is less than the red shift degree of the electroluminescence peak of the first quantum dot, and the electroluminescence peak wavelength of the quantum dot light-emitting layer is closer to the electroluminescence peak wavelength of the second quantum dot. Since the luminous intensity is proportional to the content of each component, the content of the second quantum dot is larger than that of the first quantum dot, so that the luminous intensity of the overlapping region of the electroluminescence peaks is maximized, and the luminous intensities of other regions converge toward the overlapping region, thereby narrowing the full width at half-maximum. Further, the full width at half-maximum (FWHM(b)) of the photoluminescence peak of the second quantum dot may be provided to be narrower than the full width at half-maximum (FWHM(a)) of the photoluminescence peak of the first quantum dot. That is, the full width at half-maximum of the electroluminescence peak of the quantum dot light-emitting layer may be narrowed, by narrowing the full width at half-maximum of the component whose wavelength is closer to the electroluminescence peak wavelength of the quantum dot light-emitting layer.

A material for the electron transport layer 50 is one or more of n-type ZnO, $TiO_2$, SnO, $Ta_2O_3$, AlZnO, ZnSnO, InSnO, $Alq_3$, Ca, Ba, CsF, LiF, or $CsCO_3$.

The second electrode 60 may be a cathode. The cathode is selected from one or more of Al, Ca, Ba, or Ag.

A second embodiment of the present disclosure is substantially same as the first embodiment, except that the quantum dot light-emitting layer includes at least three quantum dots, in which a difference between a maximum value and a minimum value of the photoluminescence peak wavelengths of the at least three quantum dots is less than or equal to 10 nm. As a result, in the present disclosure, the quantum dot light-emitting layer can be manufactured by using at least three quantum dots with similar photoelectric properties, thereby reducing the process difficulty and improving the production efficiency.

In the embodiment, the at least three quantum dots have the same properties as the first quantum dot and the second quantum dot in the first embodiment. Specifically, the at least three quantum dots are all colloidal quantum dots. The photoluminescence spectra of the at least three quantum dots are in the same visible light region and have close photoluminescence peak wavelengths. The photoluminescence spectra of the at least three quantum dots are in the same visible light region and have close photoluminescence peak wavelengths, in particular, meaning that the difference between the maximum value and the minimum value of the photoluminescence peak wavelengths of the at least three quantum dots is less than or equal to 10 nm. Further, the difference between the maximum value and the minimum value of the photoluminescence peak wavelengths of the at least three quantum dots is less than or equal to 5 nm. The difference between the maximum value and the minimum value of the full width at half-maximum of the photoluminescence peaks of the at least three quantum dots is less than or equal to 10 nm. Further, the difference between the maximum value and the minimum value of the full width at half-maximum of the photoluminescence peaks of the at least three quantum dots is less than or equal to 3 nm. All quantum dots encompassed in each quantum dot are manufactured in the same process, and have the photovoltaic properties with little difference with each other. The at least three quantum dots have the same or similar dispersibility in the same solvent. Here, details are not repeated.

It has been demonstrated experimentally that, the mass fraction(s) of the quantum dot(s) whose photoluminescence peak wavelength is equal to and/or close to the median of the photoluminescence peak wavelengths of the at least three quantum dots is provided to be larger than the average of mass fractions of the quantum dots, so that the fluorescence emitted at the peak wavelength may be significantly improved, and the full width at half-maximum of the quantum dot electroluminescence peak may be narrowed, thereby obtaining good photoelectric performance. In particular, the mass fractions of the quantum dots can be normally distributed with wavelengths from short to long.

The electroluminescence peak wavelength of the quantum dot light-emitting layer is theoretically closer to the median of wavelengths of the at least three quantum dots. The mass fraction of the quantum dot(s) whose photoluminescence peak wavelength(s) is equal to and/or close to the median of the photoluminescence peak wavelengths of the at least three quantum dots may be provided to be larger than the average of the mass fractions of the quantum dots. Since the luminous intensity is proportional to the content of each component, the luminous intensity of the overlapping region of the electroluminescence peaks is maximized, while the luminous intensities of other regions converge toward the overlapping region, thereby narrowing the full width at half-maximum. Further, one or two of the quantum dots having the photoluminescence peak wavelengths equal to and/or close to the median of the photoluminescence peak wavelengths of the at least three quantum dots may have the narrowest full width at half-maximum. That is, the full width at half-maximum of the electroluminescence peak of the quantum dot film may be narrowed, by narrowing the full widths at half-maximum of one or two of the components having wavelengths closer to the electroluminescence peak wavelength of the quantum dot film. Further, the full widths at half-maximum of the electroluminescence peaks of the quantum dots may be normally distributed along wavelengths from short to long.

Specifically, where the quantum dot film comprises four quantum dots, the photoluminescence peak wavelengths of the quantum dots are numbered as $\lambda(a)$, $\lambda(b)$, $\lambda(c)$, and $\lambda(d)$, respectively, which are ranked in the order of lengths as $\lambda(a)<\lambda(b)<\lambda(c)<\lambda(d)$, and the full widths at half-maximum are FWHM(a), FWHM(b), FWHM(c), and FWHM(d), respectively. The $\lambda(b)$ and $\lambda(c)$ are the median values of the electroluminescence peak wavelengths of the at least three quantum dots. The average number of mass fractions of the quantum dots is 25 wt %. In order to maximize the luminous intensity of the overlapping region of electroluminescence peaks and narrow the full width at half-maximum, the mass fractions of the quantum dots having the photoluminescence peak wavelengths of $\lambda(b)$ and $\lambda(c)$ are both greater than 25 wt % and less than 100 wt %. In a more specific embodiment, the quantum dot having the photoluminescence peak wavelength of $\lambda(b)$ and/or the quantum dot having the photoluminescence peak wavelength of $\lambda(c)$ may have the largest mass fraction among the mass fractions of all quantum dots, and have the narrowest full width at half-maximum. Further, the mass fractions of the quantum dots, and the full widths at half-maximum of the electroluminescence peaks with wavelengths from short to long, can be normally distributed. For example, a mass ratio of the quantum dots having the photoluminescence peak wavelengths of $\lambda(a)$, $\lambda(b)$, $\lambda(c)$, and $\lambda(d)$ may be 2:3:3:2.

When the quantum dot light-emitting layer comprises five quantum dots, the photoluminescence peak wavelengths of the quantum dots are numbered as $\lambda(a)$, $\lambda(b)$, $\lambda(c)$, $\lambda(d)$, and $\lambda(e)$, respectively, which are ranked in the order of lengths as $\lambda(a)<\lambda(b)<\lambda(c)<\lambda(d)<\lambda(e)$, and the full widths at half-maximum are FWHM(a), FWHM(b), FWHM(c), FWHM (d), and FWHM(e), respectively. The $\lambda(c)$ is the median value of the electroluminescence peak wavelengths of the at least three quantum dots. The average number of mass fractions of the quantum dots is 20 wt %. In order to maximize the luminous intensity of the overlapping region of electroluminescence peaks and narrow the full width at half-maximum, the mass fraction of the quantum dot having the electroluminescence peak wavelength of λ(c) is greater than 20% and less than 100%. In an embodiment, the quantum dot having the electroluminescence peak wavelength of λ(c) have the largest mass fraction among the mass fractions of all quantum dots, and have the narrowest full width at half-maximum. Further, the mass fractions of the quantum dots, and the full widths at half-maximum of the electroluminescence peaks with wavelengths from short to long, can be normally distributed.

Figure 2:
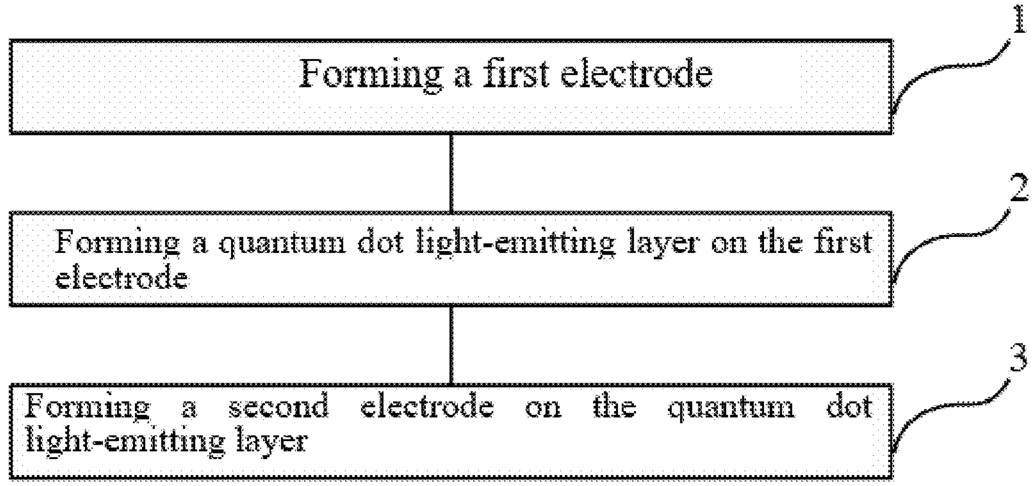
FIG. 2 is a flowchart of a method for manufacturing a quantum dot light-emitting diode according to an embodiment of the present disclosure.

Referring to FIG. 2, it is a flowchart of a method for manufacturing a quantum dot light-emitting diode according to an embodiment of the present disclosure. Referring to FIG. 3, it is a flowchart of steps for forming a quantum dot light-emitting layer on a first electrode according to an embodiment of the present disclosure. The method for manufacturing the quantum dot light-emitting diode according to the present disclosure includes the following step 1), step 2) and step 3).

At step 1), a first electrode is formed.

At step 2), a quantum dot light-emitting layer is formed on the first electrode.

At step 3), a second electrode is formed on the quantum dot light-emitting layer.

Forming the quantum dot light-emitting layer on the first electrode at step 2) further includes the following step 21) and step 22).

At step 21, a quantum dot solution comprising a first quantum dot and a second quantum dot is formulated. The absolute value of the difference between the photoluminescence (PL) peak wavelength (WLP) of the first quantum dot and the photoluminescence peak wavelength of the second quantum dot is less than or equal to 10 nm.

A solvent of the present disclosure may be, but is not limited to, one or more of n-octane, isooctane, toluene, benzene, chlorobenzene, xylene, chloroform, acetone, cyclohexane, n-hexane, n-pentane, isopentane, N,N-dimethylformamide, N,N-dimethylacetamide, N-methylpyrrolidone, dimethylsulfoxide, hexamethylphosphoramide, n-butyl ether, anisole, phenetole, acetophenone, aniline, or diphenyl ether. The materials, optical properties and the like of the first quantum dot and the second quantum dot at step 21) may refer to the above embodiment, and details are not repeated herein.

At step 22), the quantum dot solution is applied on the first electrode, and cured to form the quantum dot light-emitting layer.

At step 22), the reaction of the first quantum dot and the second quantum dot during the film forming process may refer to the first embodiment, and details are not repeated herein.

As a result, in the present disclosure, the quantum dot light-emitting layer can be manufactured by using two quantum dots with similar photoelectric properties, thereby reducing the process difficulty and improving the production efficiency.

Referring to FIGS. 2 and 4, FIG. 4 is a flowchart of steps for forming a quantum dot light-emitting layer on a first electrode according to an embodiment of the present disclosure. The embodiment of the present disclosure is substantially same as the embodiment of FIG. 3, except for the following steps.

Forming the quantum dot light-emitting layer on the first electrode at step 2) comprises the following step 221) and step 222):

At step 221), a quantum dot solution comprising at least three quantum dots is formulated. The difference between the maximum value and the minimum value of the photoluminescence peak wavelengths of the at least three quantum dots is less than or equal to 10 nm. At step 221), the materials, optical properties, and the like of the at least three quantum dots may refer to the above description, and details are not repeated herein.

At step 222), the quantum dot solution is applied on the first electrode and cured to form a quantum dot light-emitting layer. At step 222), the reactions of the at least three quantum dots during the film forming process may refer to the above description, and details are not repeated herein.

According to the method for manufacturing the quantum dot light-emitting diode of the present disclosure, two or more quantum dots with similar photoelectric performances are mixed together to prepare the quantum dot light-emitting layer of an organic light-emitting device, thereby avoiding to adjust the manufacturing process for each of quantum dots with different photoelectric performances, reducing the process difficulty, and improving the production efficiency. Moreover, the proportions of different quantum dot materials in the quantum dot film are adjusted, so that the intensity of the electroluminescence overlapping region of the multi-component quantum dot material can be enhanced, and an electroluminescence spectrum having an tunable luminescent peak in its position and a narrowed full width at half-maximum is can be obtained. The photoelectric performance of the light-emitting diode prepared by using the mixed quantum dots can be close to that of the quantum dot electroluminescent device prepared from the optimal quantum dot film in performance, and the overall photoelectric performance of the mixed quantum dot components can be improved. Hereinafter, the technical solutions of the present disclosure will be described in detail with reference to specific examples.

Example 1

Figure 5A:
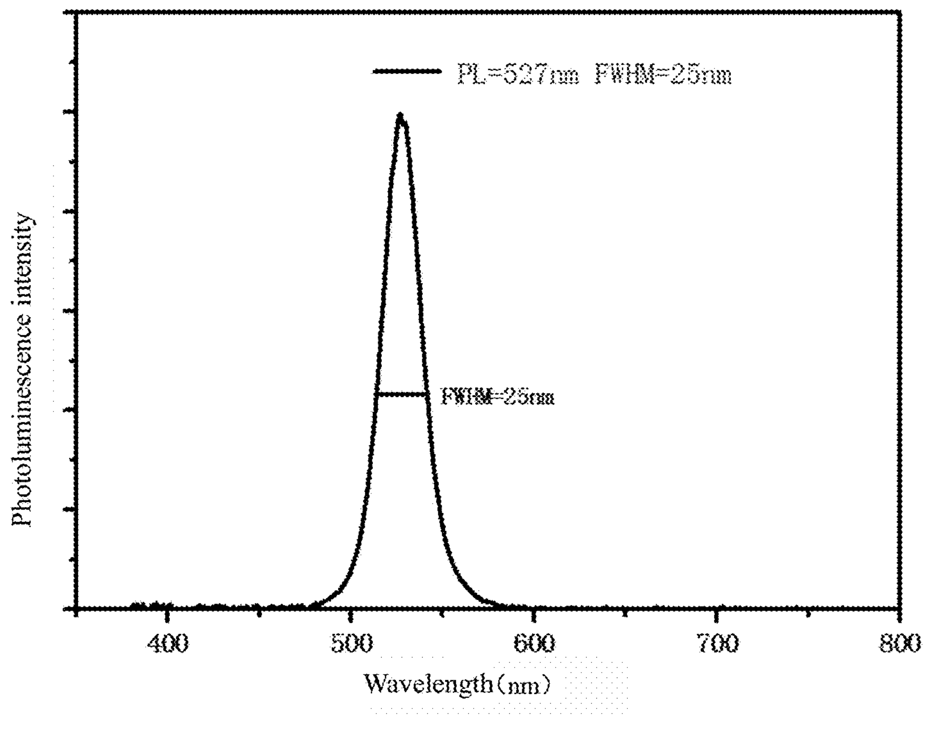
FIG. 5A shows a photoluminescence spectrum of a first quantum dot according to an embodiment of the present disclosure.
Figure 5B:
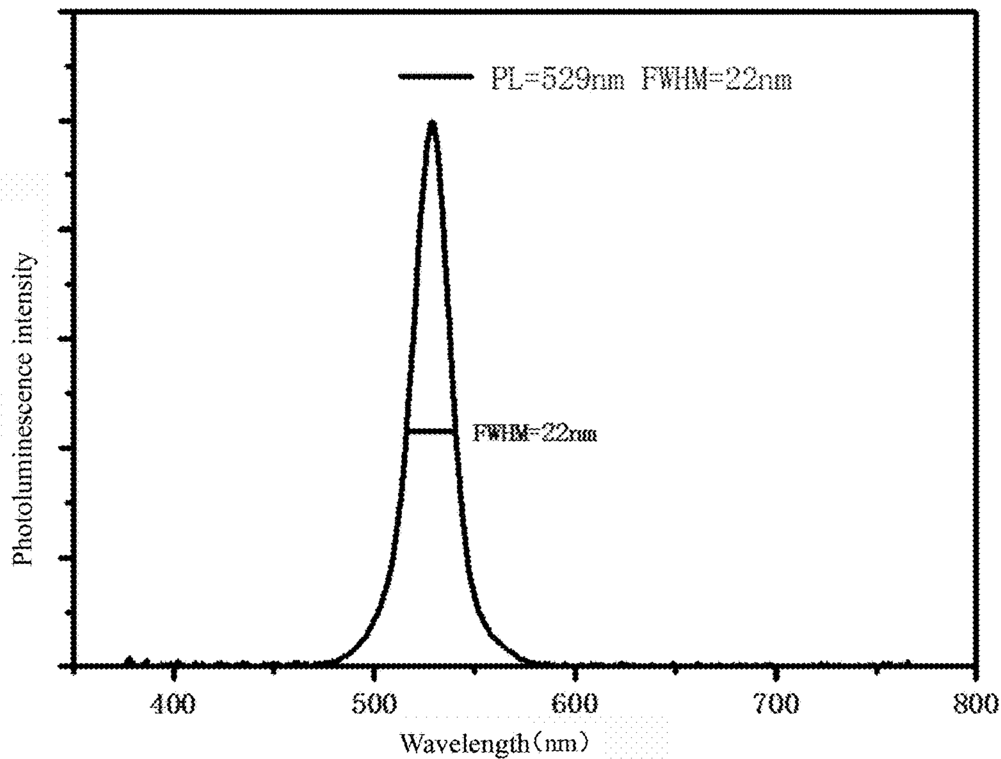
FIG. 5B shows a photoluminescence spectrum of a second quantum dot according to an embodiment of the present disclosure.
Figure 5C:
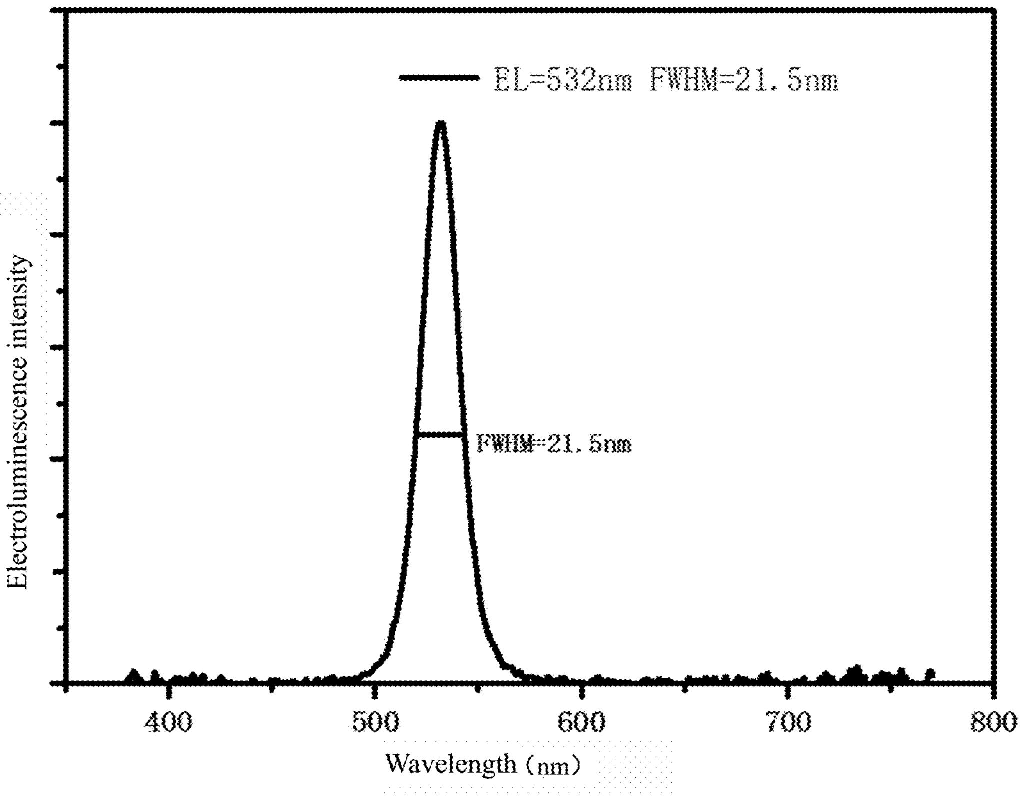
FIG. 5C shows an electroluminescence spectrum of a quantum dot light-emitting layer formed by mixing a first quantum dot and a second quantum dot in a mass ratio of 2:3 according to an embodiment of the present disclosure.
Figure 5D:
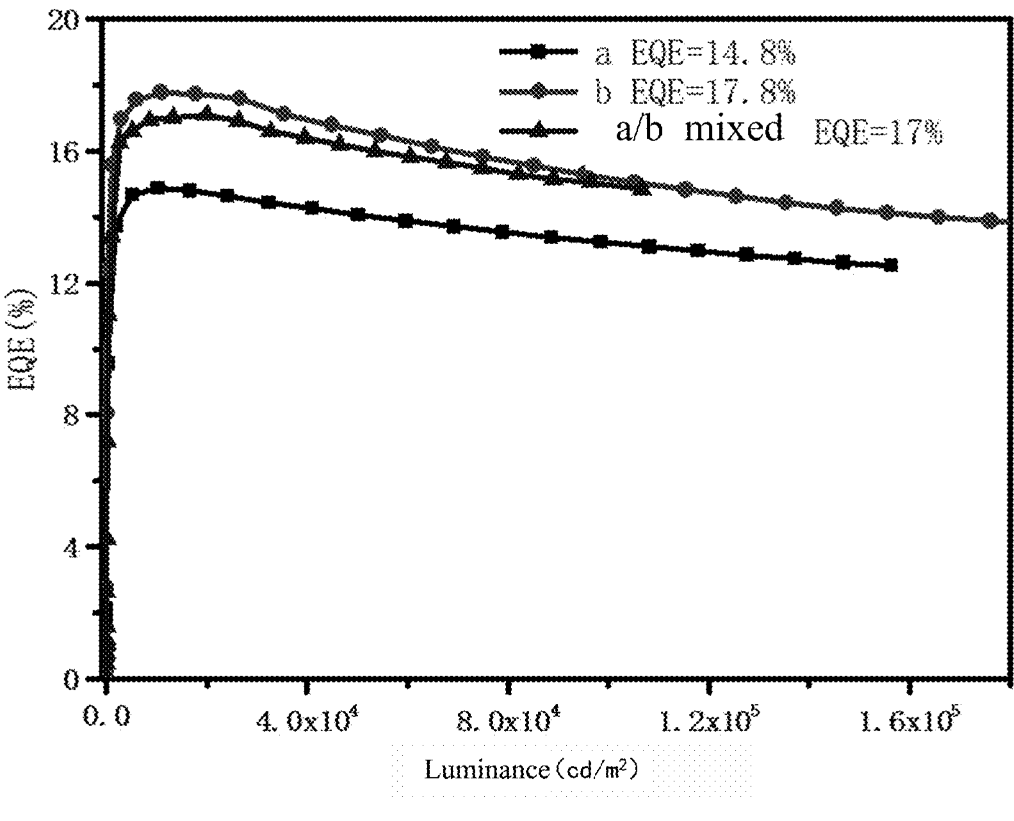
FIG. 5D is a graph of an external quantum efficiency, as a function of luminance, of a quantum dot light-emitting diode respectively formed from a first quantum dot, a second quantum dot, or a mixture of the first quantum dot and the second quantum dot, according to an embodiment of the present disclosure.

Referring to FIGS. 5(*a*) to 5(*d*), FIG. 5A shows a photoluminescence spectrum of a first quantum dot according to an embodiment of the present disclosure; FIG. 5B shows a photoluminescence spectrum of a second quantum dot according to an embodiment of the present disclosure; FIG. 5C shows an electroluminescence spectrum of a quantum dot light-emitting layer formed by mixing a first quantum dot and a second quantum dot in a mass ratio of 2:3 according to an embodiment of the present disclosure; FIG. 5D is a graph of an external quantum efficiency, as a function of luminance, of a quantum dot light-emitting diode respectively formed from a first quantum dot, a second quantum dot, or a mixture of a first quantum dot and a second quantum dot, according to an embodiment of the present disclosure. A first solution containing the first quantum dot (denoted by QD1 in Table 1) and a second solution containing the second quantum dot (denoted by QD2 in Table 1) are prepared. The first quantum dot and the second quantum dot are both core-shell green quantum dots CdZnSe/CdZnS/ZnS, in which CdZnSe is a core, and CdZnS and ZnS are shells. Both the first quantum dot and the second quantum dot can be obtained using existing synthetic methods. Solvents of both the first solution and the second solution are n-octane. The first quantum dot has an photoluminescence peak wavelength λ(a)=527 nm, a photoluminescence full width at half-maximum FWHM(a)=25 nm, and a particle size of 10 nm. The second quantum dot has an photoluminescence peak wavelength λ(b)=529 nm, an photoluminescence full width at half-maximum FWHM(b)=22 nm, and a particle size of 12 nm. The organic coating ligands on the surfaces of the first quantum dot and the second quantum dot are both oleic acid.

The first solution and the second solution are mixed to obtain a quantum dot solution, in which a mass ratio of the first quantum dot to the second quantum dot is 2:3.

The first solution, the second solution, and the quantum dot solution, each as a material for the light-emitting layer, are used to prepare quantum dot light-emitting diodes. The structure and the selected functional layer material for each of the quantum dot light-emitting diodes are shown as follows: an anode (ITO)/a hole injection layer (PEDOT:PSS)/a hole transport layer (TFB)/an organic light-emitting layer (QDs)/an electron transport layer (ZnO)/a cathode (Al). The photoelectric performances and lifetime of the quantum dot light-emitting diodes are tested, using a 128-channel life test system to determine the lifetime thereof, customized by Guangzhou Newvision Corporation, with an architecture in which the quantum dot light-emitting diodes (QLEDs) are driven by a constant voltage and constant current source, and changes in voltage or current are tested; using a photodiode detector and a test system to test luminance (photocurrent) variations of QLEDs; and using a luminance meter to test and calibrate the luminance (photocurrent) of QLEDs. The test results are shown in Table 1.

Example 2

A third solution containing a third quantum dot (denoted by QD3 in Table 1), a fourth solution containing a fourth quantum dot (denoted by QD4 in Table 1), a fifth solution containing a fifth quantum dot (denoted by QD5 in Table 1), and a sixth solution containing a sixth quantum dot (denoted by QD6 in Table 1) are prepared. The third quantum dot, the fourth quantum dot, the fifth quantum dot, and the sixth quantum dot are all core-shell red quantum dots CdZnSe/ZnSe/ZnS, in which CdZnSe is a core, and ZnSe and ZnS are shells. The solvents of the third solution, the fourth solution, the fifth solution, and the sixth solution are all n-octane. The third quantum dot has an photoluminescence peak wavelength λ(a)=626 nm, an photoluminescence full width at half-maximum of FWHM(a)=23 nm, and a particle size of 13 nm. The fourth quantum dot has an photoluminescence peak wavelength λ(b)=627.5 nm, an photoluminescence full width at half-maximum FWHM(b)=24 nm, and a particle size of 12 nm. The fifth quantum dot has an photoluminescence peak wavelength λ(c)=628 nm, an photoluminescence full width at half-maximum FWHM(b)=22 nm, and a particle size of 13.4 nm. The sixth quantum dot has an photoluminescence peak wavelength λ(d)=629 nm, an photoluminescence full width at half-maximum FWHM(d)=25 nm, and a particle size of 14 nm. The organic coating ligands on the surfaces of the third quantum dot, the fourth quantum dot, the fifth quantum dot, and the sixth quantum dot are all octanethiol.

The third solution to the sixth solution are mixed to obtain a quantum dot solution, in which a mass ratio of the third quantum dot, the fourth quantum dot, the fifth quantum dot, and the sixth quantum dot in the quantum dot solution is 2:3:3:2.

The third solution, the fourth solution, the fifth solution, the sixth solution, and the quantum dot solution, each as a material for the light-emitting layer, are used to prepare quantum dot light-emitting diode. The structure and the selected functional layer material of each of the quantum dot light-emitting diodes are shown as follows: an anode (ITO)/a hole injection layer (PEDOT:PSS)/a hole transport layer (TFB)/an organic light-emitting layer (QDs)/an electron transport layer (ZnO)/a cathode (Al). The photoelectric performances and lifetime of the quantum dot light-emitting diodes are tested, using the same test system and method as in Example 1. The test results are shown in Table 1.

Comparative Example 1

The quantum dot light-emitting diode of Comparative Example 1 is substantially identical to Example 1, except that the mass ratio of the first quantum dot to the second quantum dot in the quantum dot solution is 3:2.

The photoelectric performances and lifetime of the quantum dot light-emitting diode are tested, using the same test system and method as that in Example 1. The test results are shown in Table 1.

Comparative Example 2

The quantum dot light-emitting diode of Comparative Example 2 is substantially identical to Example 2, except that the mass ratio of the third quantum dot, the fourth quantum dot, the fifth quantum dot, and the sixth quantum dot in the quantum dot solution is 1:1:1:1.

The photoelectric performances and lifetime of the quantum dot light-emitting diode are tested, using the same test system and method as that in Example 1. The test results are shown in Table 1.

TABLE 1

Test data of quantum dot light-emitting diodes prepared in the Examples 1-2 and Comparative Examples 1-2 according to the present disclosure.

| | Light-emitting layer sample | Photoluminescence | | Electroluminescent | | Performance parameters of light-emitting diodes | |
|---|---|---|---|---|---|---|---|
| | Component and mass ratio | WLP (nm) | FWHM (nm) | WLP (nm) | FWHM (nm) | EQE (%) | $T_{95}$@1000 nit (h) |
| Example 1 | QD1 | 527 | 25 | 531 | 26 | 14.8 | 3900 |
| | QD2 | 529 | 22 | 532.5 | 23 | 17.8 | 4400 |
| | QD1:QD2 = 2:3 | / | / | 532 | 21.5 | 17 | 4300 |
| Example 2 | QD3 | 626 | 23 | 629 | 24 | 18 | 1550 |
| | QD4 | 627.5 | 24 | 630 | 24 | 16 | 2080 |
| | QD5 | 628 | 22 | 631.5 | 23 | 19 | 2160 |
| | QD6 | 629 | 25 | 632 | 26 | 14 | 2510 |
| | QD3:QD4:QD5:QD6 = 2:3:3:2 | / | / | 630.5 | 22 | 17.8 | 2300 |

TABLE 1-continued

Test data of quantum dot light-emitting diodes prepared in the Examples 1-2 and Comparative Examples 1-2 according to the present disclosure.

| | Light-emitting layer sample | Photoluminescence | | Electroluminescent | | Performance parameters of light-emitting diodes | |
|---|---|---|---|---|---|---|---|
| | Component and mass ratio | WLP (nm) | FWHM (nm) | WLP (nm) | FWHM (nm) | EQE (%) | $T_{95}$@1000 nit (h) |
| Comparative Example 1 | QD1:QD2 = 3:2 | / | / | 531 | 24 | 14 | 2500 |
| Comparative Example 2 | QD3:QD4:QD5:QD6 = 1:1:1:1 | / | / | 629.5 | 25 | 13.8 | 1700 |

As can be seen from Table 1, in Example 1, the first quantum dot and the second quantum dot have the photoluminescence peak wavelengths of λ(a)=527 nm and λ(b)=529 nm, the full widths at half-maximum of 25 nm and 22 nm, and the particle sizes of 10 nm and 12 nm, respectively. The quantum dot light-emitting diodes prepared by using the first quantum dot and the second quantum dot as the light-emitting layer materials have the electroluminescence peak wavelengths of 531 nm and 532.5 nm, EQEs of 14.8% and 17.8%, and lifetime test $T_{95}$@1000 nit data of 3900 h and 4400 h, respectively.

The quantum dot light-emitting diode prepared by a mixture of the first quantum dot and the second quantum dot in a mass ratio of 2:3 as the quantum dot light-emitting layer material has an electroluminescence peak wavelength of 532 nm, a full width at half-maximum of 21.5 nm, EQE of 17%, and $T_{95}$@1000 nit=4300 h. The difference between the photoluminescence peak wavelengths of the first quantum dot and the second quantum dot is 2 nm. The second quantum dot has a relatively long photoluminescence peak wavelength and a relatively narrow full width at half-maximum. For the electroluminescent device prepared using a mixture of the first quantum dot and the second quantum dot in a mass ratio of 2:3, its electroluminescence peak is subjected to a certain red shift relative to the photoluminescence peak, and has the maximum luminous intensity at the 532 nm, i.e., the overlapping region, with a single-peak morphology. The electroluminescence peak wavelength of the quantum dot light-emitting layer prepared using a mixture of the first quantum dot and the second quantum dot in a mass ratio of 2:3 is between the electroluminescence peak wavelength of the device in which the first quantum dot is used as the quantum dot light-emitting layer material alone and the electroluminescence peak wavelength of the device in which the second quantum dot is used as the quantum dot light-emitting layer material alone, and the full width at half-maximum of the electroluminescence peak is only 21.5 nm, which is narrower than the full widths at half-maximum of the electroluminescence peaks of the devices in which the first and second quantum dots are used as the quantum dot light-emitting layer materials alone. In addition, both EQE and $T_{95}$@1000 nit are close to optimal data of the first quantum dot and the second quantum dot.

In Example 2, the third quantum dot, the fourth quantum dot, the fifth quantum dot, and the sixth quantum dot have the photoluminescence peak wavelengths of λ(a)=626 nm, λ(b)=627.5 nm, λ(c)=628 nm, λ(d)=629 nm, the full widths at half-maximum of 23 nm, 24 nm, 22 nm, and 25 nm, and the particle sizes in a range of 13±1.5 nm. For the quantum dot light-emitting diodes prepared respectively using the third quantum dot, the fourth quantum dot, the fifth quantum dot, and the sixth quantum dot as the light-emitting layer materials, they have the electroluminescence peak wavelengths of 629 nm, 630 nm, 631.5 nm, and 632 nm, the EQEs of 18%, 16%, 19%, and 14%, and the lifetime test $T_{95}$@1000 nit data of 1550 h, 2080 h, 2160 h, and 2510 h, respectively. The quantum dot light-emitting diode prepared using a mixture of the third quantum dot, the fourth quantum dot, the fifth quantum dot, and the sixth quantum dot in a mass ratio of 2:3:3:2 as the quantum dot light-emitting layer material has the electroluminescence peak wavelength of 630.5 nm, the full width at half-maximum of 22 nm, EQE of 17.8%, and $T_{95}$@1000 nit=2300 h.

The electroluminescence peak wavelength of the quantum dot light-emitting layer prepared from a mixture of the third quantum dot, the fourth quantum dot, the fifth quantum dot, and the sixth quantum dot in a mass ratio of 2:3:3:2 is close to the median of the electroluminescence peak wavelengths of the devices prepared from the third quantum dot, the fourth quantum dot, the fifth quantum dot, and the sixth quantum dot alone as the quantum dot light-emitting layer materials. The full width at half-peak of the electroluminescence peak is only 22 nm, which is narrower than that of the electroluminescence peaks of the devices prepared from the third quantum dot, the fourth quantum dot, the fifth quantum dot, or the sixth quantum dot alone, and the second quantum dot alone, as a material for the quantum dot light-emitting layer. In addition, both of EQE and $T_{95}$@1000 nit are close to the optimal data of the third to sixth quantum dots.

Still comparing Example 1 with Comparative Example 1, in the case that the content of the second quantum dot is high, since a luminous intensity is proportional to the content of each component, the luminous intensity of the overlapping region of the electroluminescence peaks is maximized, and the luminous intensities of other regions converge toward the overlapping region, thereby narrowing the full width at half-maximum. Further, the full width at half-maximum of the electroluminescence peak is narrower, and both of EQE (%) and $T_{95}$@1000 nit are better.

Still comparing Example 2 with Comparative Example 2, where the quantum dot light-emitting layer is composed of at least three quantum dots, the electroluminescence peak of the quantum dot light-emitting layer may be closer to the median value of wavelengths of the at least three quantum dots. In the case that the contents of the fourth and fifth quantum dots are high, since an luminous intensity is proportional to the content of each component, the luminous intensity of an overlapping region of the electroluminescence peaks is maximized, and the luminous intensities of other regions converge toward the overlapping region, thereby narrowing the full width at half-maximum. Further, in Example 2, the mass fractions of the quantum dots are normally distributed according to the length of their wavelengths, and the full width at half-maximum of the electroluminescence peak is narrower. In addition, both of EQE (%) and $T_{95}$@1000 nit are better.

In addition, the present disclosure also provides a quantum dot film including a first quantum dot and a second quantum dot, wherein an absolute value of a difference between a photoluminescence peak wavelength of the first quantum dot and a photoluminescence peak wavelength of the second quantum dot is less than or equal to 10 nm.

The first and second quantum dots are both colloidal quantum dots. That is, the first quantum dot and the second quantum dot may be dispersed and reserved in a solution, respectively. During formation of the quantum dot film, the first solution containing the first quantum dot may be mixed with the second solution containing the second quantum dot in a certain ratio. The solvent of the first solution may be same as or similar to in nature the solvent of the second solution, for example, both are polar solvents or non-polar solvents. In an embodiment, the solvent of the first solution is same as the solvent of the second solution.

The photoluminescence spectra of the first and second quantum dots are in the same visible light region. For example, both of the first and second quantum dots are green quantum dots. In an embodiment, the first quantum dot and the second quantum dot may be different batches of quantum dots manufactured using the same material and the same process. In another embodiment, the first quantum dot and the second quantum dot may be ones manufactured using different materials and/or different processes, and it is sufficient that the photoluminescence spectra of the first quantum dot and the second quantum dot are in the same visible light region and their photoluminescence peak wavelengths are close to each other. The phrase "photoluminescence peak wavelengths being close to each other" may refer to the absolute value of the difference between the photoluminescence peak wavelength of the first quantum dot and the photoluminescence peak wavelength of the second quantum dot is less than or equal to 10 nm. When the difference between the photoluminescence peak wavelength of the first quantum dot and the photoluminescence peak wavelength of the second quantum dot is sufficiently low, the electroluminescence peaks of the first quantum dot and the second quantum dot may overlap after the red shift to obtain an electroluminescence spectrum with a higher color purity, after the quantum dot composition is cured into the quantum dot light-emitting layer. Further, the absolute value of the difference between the photoluminescence peak wavelength of the first quantum dot and the photoluminescence peak wavelength of the second quantum dot is less than or equal to 5 nm.

In order to allow the electroluminescence peak of the quantum dot film to have a narrow full width at half-maximum, in an embodiment, an absolute value of a difference between a full width at half-maximum of a photoluminescence peak of the first quantum dot and a full width at half-maximum of a photoluminescence peak of the second quantum dot is less than or equal to 10 nm. Further, the absolute value of the difference between the full width at half-maximum of the photoluminescence peak of the first quantum dot and that of the second quantum dot is less than or equal to 3 nm.

In the present disclosure, unless otherwise specified, all quantum dots encompassed in the first quantum dot are manufactured in the same process and have little difference in photoelectric performances, and all quantum dots encompassed in the second quantum dot are manufactured in the same process and have little difference in photoelectric performances. For example, the photoelectric performances of a plurality of electroluminescent devices prepared from the first quantum dot, such as an external quantum efficiency (EQE) and time taken from the manual maximum luminance of 1000 nit to 95% of the maximum luminance (expressed by $T_{95}$@1000 nit), fluctuate in variability by no more than 50%. If the difference in the performances is too large, the quantum dot device prepared from the mixed quantum dots as the material for the light-emitting layer, generates a serious non-radiation recombination transition, resulting in degradation of the device performances and failure to obtain stable photoelectric performances. When the difference in the photoelectric properties of the same type of quantum dots is not too large, it is possible to ensure that the fluorescence portions by electroluminescence of the quantum dot compositions have a large overlapping portion with each other, avoiding the occurrence of shoulder peaks or multiple peaks.

The quantum dots may include at least one of, in the periodic table of elements, a group IV, a group II-V, a group II-VI, a group III-VI, a group III-V, a group IV-VI, a group VI-VI, a group VIII-VI, a group I-III-VI, a group II-IV-VI, or a group II-IV-V, in a form of a single or composite structure of quantum dots. The composite structure of quantum dots includes a core-shell structure, in which a material for constituting the core of the core-shell structure includes at least one of CdSe, CdS, CdTe, CdSeTe, CdZnS, PbSe, ZnTe, CdSeS, PbS, PbTe, HgS, HgSe, HgTe, GaN, GaP, GaAs, InP, InAs, InZnP, InGaP, or InGaN, and a material for constituting the shell of the core-shell structure includes at least one of ZnSe, ZnS, or ZnSeS.

The first quantum dot and the second quantum dot have the same or similar dispersibility in the same solvent, so as to avoid solubility deterioration due to the intermixing of different components. More specifically, the surface of the first quantum dot has a first organic ligand. The surface of the second quantum dot has a second organic ligand. The first organic ligand and the second organic ligand can be dissolved in the same solvent. In an embodiment, the first organic ligand is same as the second organic ligand. The first organic ligand and the second organic ligand are each independently selected from one or more of oleic acid, oleylamine, an alkyl acid having 4 to 20 carbon atoms, trioctylphosphine, tributylphosphine, trioctylphosphine oxide, hexylphosphonic acid, ethylamine, triethylamine, propylamine, tripropylamine, butylamine, tributylamine, pentylamine, tripentylamine, n-hexylamine, trihexylamine, heptylamine, octylamine, trioctylamine, di-n-octylamine, decylamine, dodecylamine, trilaurylamine, tetradecylamine, hexadecylamine, octadecylamine, dioctadecylamine, or dodecanethiol.

When the first quantum dot and the second quantum dot are dispersed in a solvent, the distance between the quantum dot luminescent cores of the first and second quantum dots is too large to generate an energy resonance transfer. After the quantum dot film is formed, the distance between the first quantum dot and the second quantum dot may be shortened to a range where the energy resonance transfer may occur. Specifically, the energy resonance transfer in the quantum dot film is the phenomenon in which energy is transferred from the high-energy state donor (emitting light of short wavelength) to the adjacent low-energy state acceptor (emitting light of long wavelength), representing as a red shift of the electroluminescence peak. When the photoluminescence peak wavelengths of the first quantum dot and the second quantum dot are sufficiently close to each other, for example, the absolute value of the difference between the photoluminescence peak wavelength of the first quantum dot and the photoluminescence peak wavelength of the second quantum dot is less than or equal to 10 nm, the spacing between the first quantum dot and the second quantum dot may be reduced to a range capable of generating an energy resonance transfer after the quantum dot film is formed. When the energy resonance transfer occurs between the first quantum dot and the second quantum dot, the energy may be transferred from the high energy state donor (a quantum dot emitting light of a shorter wavelength) to the adjacent low energy state acceptor (a quantum dot emitting light of a longer wavelength). The quantum dot emitting light of a shorter wavelength releases energy, generating a red shift, and the quantum dot emitting light of a longer wavelength receive energy, generating a blue shift. That is, after the two quantum dots are subjected to energy resonance, their luminescence peaks are close to each other and superimposed, obtaining enhanced fluorescence at the same wavelength position, and giving an electroluminescence spectrum with higher color purity.

It has been experimentally demonstrated that, adjusting the mass fractions and the full widths at half-maximum of the first and second quantum dots can significantly enhance the fluorescence emitted at the peak wavelength, and render a narrowing trend in the full width at half-maximum of the electroluminescence peak of the quantum dot light-emitting layer formed by curing the quantum dot film, thereby exhibiting better monochromaticity. Meanwhile, the photovoltaic performance exhibited by the device prepared using the quantum dot film is dominated by a portion with the most significant enhancement of fluorescence, and the overall photovoltaic performance thereof is close to a property of an optimal one of the first quantum dot and the second quantum dot.

For example, in the present embodiment, the quantum dot light-emitting layer is composed of the first quantum dot and the second quantum dot. The photoluminescence peak wavelength λ(b) of the second quantum dot is larger than the photoluminescence peak wavelength λ(a) of the first quantum dot. It has been experimentally demonstrated that, by allowing the mass fraction of the second quantum dot to be larger than that of the first quantum dot, the fluorescence emitted at the peak wavelength can be improved significantly, and the full width at half-maximum of the quantum dot electroluminescence peak can be narrowed, thereby obtaining good photoelectric performances. Specifically, the mass fraction of the second quantum dots is greater than 50 wt % and less than 100 wt %, and the mass fraction of the first quantum dots is greater than 0 wt % and less than 50 wt %.

Energy loss may occur in the process of energy transfer resonance. If the mass fraction of the second quantum dot is less than that of the first quantum dot, the red shift of the first quantum dot mat be relatively low due to the energy loss, and the electroluminescence peaks of the second quantum dot and the first quantum dot overlap to a low degree, resulting in impossibility to obtain significant fluorescence enhancement and to narrow the full width at half-maximum. In addition, due to the energy loss, the blue shift degree of the electroluminescence peak of the second quantum dot is less than the red shift degree of the electroluminescence peak of the first quantum dot, and the electroluminescence peak wavelength of the quantum dot light-emitting layer is closer to the electroluminescence peak wavelength of the second quantum dot. Since the luminous intensity is proportional to the content of each component, the content of the second quantum dot is larger than that of the first quantum dot, so that the luminous intensity of the overlapping region of the electroluminescence peaks is maximized, and the luminous intensities of other regions converge toward the overlapping region, thereby narrowing the full width at half-maximum. Further, the full width at half-maximum (FWHM(b)) of the photoluminescence peak of the second quantum dot may be provided to be narrower than the full width at half-maximum (FWHM(a)) of the photoluminescence peak of the first quantum dot. That is, the full width at half-maximum of the electroluminescence peak of the quantum dot light-emitting layer may be narrowed, by narrowing the full width at half-maximum of the component whose wavelength is closer to the electroluminescence peak wavelength of the quantum dot light-emitting layer.

Another embodiment of the present disclosure provides a quantum dot film substantially same as the above embodiments, except that:

The quantum dot film comprises at least three quantum dots, and a difference between a maximum value and a minimum value of the photoluminescence peak wavelengths of the at least three quantum dots is less than or equal to 10 nm.

According to the embodiment of the present disclosure, a quantum dot film including at least three quantum dots with similar photoelectric properties are used to manufacture the quantum dot light-emitting layer, thereby reducing process difficulty and improving production efficiency. In this embodiment, the at least three quantum dots have the same properties as the first and second quantum dots in the first embodiment. Specifically, the at least three quantum dots are colloidal quantum dots. The photoluminescence spectra of the at least three quantum dots are in the same visible light region, and the photoluminescence peak wavelengths thereof are close to each other, which means that, the difference between the maximum value and the minimum value of the photoluminescence peak wavelengths of the at least three quantum dots is less than or equal to 10 nm. Further, the difference between the maximum value and the minimum value of the photoluminescence peak wavelengths of the at least three quantum dots is less than or equal to 5 nm. A difference between a maximum value and a minimum value of the full widths at half-maximum of the photoluminescence peaks of the at least three quantum dots is less than or equal to 10 nm. Further, the difference between the maximum value and the minimum value of the full widths at half-maximum of the photoluminescence peaks of the at least three quantum dots is less than or equal to 3 nm. All quantum dots encompassed in each of the quantum dots are manufactured in the same process, and have little difference in the photovoltaic properties. The at least three quantum dots have the same or similar dispersibility in the same solvent. Here, details are not repeated.

It has been demonstrated experimentally that the mass fraction of the quantum dots whose photoluminescence peak wavelengths are equal to and/or close to the median of the photoluminescence peak wavelengths of the at least three quantum dots is provided to be larger than the average of mass fractions of the quantum dots, so that the fluorescence emitted at the peak wavelength may be significantly improved, and the full width at half-maximum of the quantum dot electroluminescence peak may be narrowed, thereby obtaining good photoelectric performance. In particular, the mass fractions of the quantum dots can be normally distributed with wavelengths from short to long.

The electroluminescence peak wavelength of the quantum dot light-emitting layer is theoretically closer to the median of wavelengths of the at least three quantum dots. The mass fraction of the quantum dot(s) whose photoluminescence peak wavelength(s) is equal to and/or close to the median of the photoluminescence peak wavelengths of the at least three quantum dots may be provided to be larger than the average of the mass fractions of the quantum dots. Since the luminous intensity is proportional to the content of each component, the luminous intensity of the overlapping region of the electroluminescence peaks is maximized, while the luminous intensities of other regions converge toward the overlapping region, thereby narrowing the full width at half-maximum. Further, one or two of the quantum dots having the photoluminescence peak wavelengths equal to and/or close to the median of the photoluminescence peak wavelengths of the at least three quantum dots may have the narrowest full width at half-maximum. That is, the full width at half-maximum of the electroluminescence peak of the quantum dot film may be narrowed, by narrowing the full widths at half-maximum of one or two of the components having a wavelength closer to the electroluminescence peak wavelength of the quantum dot film. Further, the full widths at half-maximum of the electroluminescence peaks of the quantum dots may be normally distributed along wavelengths from short to long.

Specifically, where the quantum dot film comprises four quantum dots, the photoluminescence peak wavelengths of the quantum dots are numbered as λ(a), λ(b), λ(c), and λ(d), respectively, which are ranked in the order of lengths as $\lambda(a)<\lambda(b)<\lambda(c)<\lambda(d)$, and the full widths at half-maximum are FWHM(a), FWHM(b), FWHM(c), and FWHM(d), respectively. The λ(b) and λ(c) are the median values of the electroluminescence peak wavelengths of the at least three quantum dots. The average number of mass fractions of the quantum dots is 25 wt %. In order to maximize the luminous intensity of the overlapping region of electroluminescence peaks and narrow the full width at half-maximum, the mass fractions of the quantum dots having the photoluminescence peak wavelengths of λ(b) and λ(c) are both greater than 25 wt % and less than 100 wt %. In a more specific embodiment, the quantum dot having the photoluminescence peak wavelength of λ(b) and/or the quantum dot having the photoluminescence peak wavelength of λ(c) may have the largest mass fraction among the mass fractions of all quantum dots, and have the narrowest full width at half-maximum. Further, the mass fractions of the quantum dots, and the full widths at half-maximum of the electroluminescence peaks with wavelengths from short to long, can be normally distributed. For example, a mass ratio of the quantum dots having the photoluminescence peak wavelengths of λ(a), λ(b), λ(c), and λ(d) may be 2:3:3:2.

Where the quantum dot film comprises five quantum dots, the photoluminescence peak wavelengths of the quantum dots are numbered as λ(a), λ(b), λ(c), λ(d), and λ(e), respectively, which are ranked in the order of lengths as $\lambda(a)<\lambda(b)<\lambda(c)<\lambda(d)<\lambda(e)$, and the full widths at half-maximum are FWHM(a), FWHM(b), FWHM(c), FWHM(d), and FWHM(e), respectively. The λ(c) is the median value of the electroluminescence peak wavelengths of the at least three quantum dots. The average number of mass fractions of the quantum dots is 20 wt %. In order to maximize the luminous intensity of the overlapping region of electroluminescence peaks and narrow the full width at half-maximum, the mass fraction of the quantum dot having the electroluminescence peak wavelength of λ(c) is greater than 20% and less than 100%. In an embodiment, the quantum dot having the electroluminescence peak wavelength of λ(c) have the largest mass fraction among the mass fractions of all quantum dots, and have the narrowest full width at half-maximum. Further, the mass fractions of the quantum dots, and the full widths at half-maximum of the electroluminescence peaks with wavelengths from short to long, can be normally distributed.

An embodiment of the present disclosure provides a quantum dot light-emitting diode, a manufacturing method thereof, and a quantum dot film. The quantum dot light-emitting diode includes a first electrode, a second electrode, and a quantum dot light-emitting layer arranged between the first electrode and the second electrode. The quantum dot light-emitting layer comprises a first quantum dot and a second quantum dot, and an absolute value of a difference between a photoluminescence peak wavelength of the first quantum dot and a photoluminescence peak wavelength of the second quantum dot is less than or equal to 10 nm. According to the embodiment of the present disclosure, two quantum dots having similar photoelectric properties are used to manufacture the light-emitting device and the quantum dot film, thereby reducing process difficulty and improving production efficiency.

According to the method for manufacturing the quantum dot light-emitting diode of the present disclosure, two or more quantum dots with similar photoelectric performance are mixed together to prepare the quantum dot light-emitting layer of the organic light-emitting device, thereby avoiding the need to adjust the preparation process for the quantum dots with different photoelectric properties individually, reducing the difficulty of the process, and improving the production efficiency. Moreover, the proportions of different quantum dot materials in the quantum dot film is adjusted to enhance the intensity of the electroluminescence overlapping region of a plurality of quantum dot materials, thereby obtaining an electroluminescence spectrum with a tunable luminescence peak position and a narrowed full width at half-maximum. The photoelectric performance of the light-emitting diode prepared using the mixed quantum dots can be close to that of the quantum dot electroluminescent device having a quantum dot film of the optimal performance, and the overall photoelectric performance of the mixed quantum dot components is improved.

The foregoing has provided a detailed description of embodiments of the present disclosure, and specific examples have been applied herein to illustrate the principles and embodiments of the present disclosure. The foregoing description of embodiments is provided merely to assist in understanding the present disclosure. For those skilled in the art, variations will be made in specific implementation and application scope in accordance with the teachings of the present disclosure. In view of the foregoing, the contents of this specification should not be construed as limiting the application.

What is claimed is:

1. A quantum dot light-emitting diode comprising:

a first electrode;

a second electrode; and a quantum dot light-emitting layer disposed between the first electrode and the second electrode;

wherein the quantum dot light-emitting layer comprises a first quantum dot and a second quantum dot, and an absolute value of a difference between a photoluminescence peak wavelength of the first quantum dot and a photoluminescence peak wavelength of the second quantum dot is less than or equal to 10 nm.

2. The quantum dot light-emitting diode according to claim 1, wherein the absolute value of the difference between the photoluminescence peak wavelength of the first quantum dot and the photoluminescence peak wavelength of the second quantum dot is less than or equal to 5 nm.

3. The quantum dot light-emitting diode according to claim 1, wherein the quantum dot light-emitting layer is composed of the first quantum dot and the second quantum dot, the photoluminescence peak wavelength of the second quantum dot is greater than the photoluminescence peak wavelength of the first quantum dot, a mass fraction of the second quantum dot is greater than 50 wt % and less than 100 wt %, and a mass fraction of the first quantum dot is greater than 0 wt % and less than 50 wt %.

4. The quantum dot light-emitting diode according to claim 3, wherein a full width at half-maximum of the photoluminescence peak of the second quantum dot is less than a full width at half-maximum of the photoluminescence peak of the first quantum dot.

5. The quantum dot light-emitting diode according to claim 1, wherein the quantum dot light-emitting layer comprises at least three quantum dots, a difference between a maximum value and a minimum value of photoluminescence peak wavelengths of the at least three quantum dots is less than or equal to 10 nm, and a mass fraction of a quantum dot having a median of the photoluminescence peak wavelengths of the at least three quantum dots is greater than an average of mass fractions of the at least three quantum dots.

6. The quantum dot light-emitting diode according to claim 5, wherein, among the at least three quantum dots, one or two of quantum dots having the median of the photoluminescence peak wavelengths have a narrowest full width at half-maximum.

7. The quantum dot light-emitting diode according to claim 1, wherein an absolute value of a difference between a full width at half-maximum of the photoluminescence peak of the first quantum dot and a full width at half-maximum of the photoluminescence peak of the second quantum dot is less than or equal to 10 nm.

8. The quantum dot light-emitting diode according to claim 1, wherein an absolute value of a difference between a full width at half-maximum of the photoluminescence peak of the first quantum dot and a full width at half-maximum of the photoluminescence peak of the second quantum dot is less than or equal to 3 nm.

9. A quantum dot film comprising:

a first quantum dot and a second quantum dot, wherein an absolute value of a difference between a photoluminescence peak wavelength of the first quantum dot and a photoluminescence peak wavelength of the second quantum dot is less than or equal to 10 nm.

10. The quantum dot film according to claim 9, wherein the absolute value of the difference between the photoluminescence peak wavelength of the first quantum dot and the photoluminescence peak wavelength of the second quantum dot is less than or equal to 5 nm.

11. The quantum dot film according to claim 9, wherein the quantum dot film is composed of the first quantum dot and the second quantum dot, the photoluminescence peak wavelength of the second quantum dot is greater than the photoluminescence peak wavelength of the first quantum dot, and a mass fraction of the second quantum dot is greater than a mass fraction of the first quantum dot.

12. The quantum dot film according to claim 11, wherein a full width at half-maximum of the photoluminescence peak of the second quantum dot is less than a full width at half-maximum of the photoluminescence peak of the first quantum dot.

13. The quantum dot film according to claim 9, wherein the quantum dot film comprises at least three quantum dots, a difference between a maximum value and a minimum value of photoluminescence peak wavelengths of the at least three quantum dots is less than or equal to 10 nm, and a mass fraction of a quantum dot having a median of the photoluminescence peak wavelengths of the at least three quantum dots is greater than an average of mass fractions of the at least three quantum dots.

14. The quantum dot film according to claim 13, wherein, among the at least three quantum dots, one or two of quantum dots having the median of the photoluminescence peak wavelengths have a narrowest full width at half-maximum.

15. The quantum dot film according to claim 9, wherein an absolute value of a difference between a full width at half-maximum of the photoluminescence peak of the first quantum dot and a full width at half-maximum of the photoluminescence peak of the second quantum dot is less than or equal to 10 nm.

16. The quantum dot film according to claim 9, wherein an absolute value of a difference between a full width at half-maximum of the photoluminescence peak of the first quantum dot and a full width at half-maximum of the photoluminescence peak of the second quantum dot is less than or equal to 3 nm.

* * * * *